United States Patent
Lin et al.

(10) Patent No.: US 10,756,083 B2
(45) Date of Patent: Aug. 25, 2020

(54) DEVICE WITH A HIGH EFFICIENCY VOLTAGE MULTIPLIER

(71) Applicant: Taiwan Semiconductor Manufacturing Company Limited, Hsinchu (TW)

(72) Inventors: Yu-Tso Lin, New Taipei (TW); Chih-Hsien Chang, Taipei (TW); Min-Shueh Yuan, Taipei (TW); Robert Bogdan Staszewski, Dulin (IE); Seyednaser Pourmousavian, Dublin (IE)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/602,246

(22) Filed: May 23, 2017

(65) Prior Publication Data
US 2018/0342495 A1    Nov. 29, 2018

(51) Int. Cl.
| | | |
|---|---|---|
| G05F 1/10 | (2006.01) | |
| G05F 3/02 | (2006.01) | |
| H01L 27/06 | (2006.01) | |
| G11C 16/30 | (2006.01) | |
| H01L 29/94 | (2006.01) | |
| H01L 27/07 | (2006.01) | |
| H02M 3/07 | (2006.01) | |

(52) U.S. Cl.
CPC .......... H01L 27/0629 (2013.01); G11C 16/30 (2013.01); H01L 27/0788 (2013.01); H01L 29/94 (2013.01); H02M 3/07 (2013.01)

(58) Field of Classification Search
CPC .. H02M 3/073; H02M 3/07; H02M 2003/077; G11C 5/145; G05F 3/205
USPC .......................................................... 327/536
See application file for complete search history.

(56) References Cited

U.S. PATENT DOCUMENTS

| | | | | |
|---|---|---|---|---|
| 8,232,835 B2 * | 7/2012 | Kim | ........................ | H02M 3/07 323/289 |
| 2007/0194834 A1 * | 8/2007 | Sohara | .................... | H02M 3/07 327/536 |
| 2007/0279950 A1 * | 12/2007 | Sugiyama | ............... | H02M 3/07 363/59 |
| 2010/0109063 A1 * | 5/2010 | Hayashida | .......... | H01L 27/0629 257/300 |
| 2011/0018618 A1 * | 1/2011 | Shiu | ........................ | H02M 3/07 327/536 |

* cited by examiner

*Primary Examiner* — Anh Q Tra
(74) *Attorney, Agent, or Firm* — Jones Day (57) ABSTRACT

A device includes a capacitive element that is coupled between first and second nodes and that includes a first well region, a second well region, and a transistor. The second well region is formed in the first well region, has a different conductivity type than the first well region, and is coupled to the second node. The transistor includes source and drain regions formed in the second well region and coupled to each other and to the second node, a channel region between the source and drain regions, and a gate region over the channel region. The first well region and the gate region are coupled to each other and to the first node, whereby a capacitance of the capacitive element is increased without substantially enlarging a physical size of the capacitive element.

20 Claims, 5 Drawing Sheets

DEVICE WITH A HIGH EFFICIENCY VOLTAGE MULTIPLIER

BACKGROUND

A device uses a voltage multiplier to generate a voltage higher than, e.g., twice, a supply voltage. For example, a device, such as a memory device, may read a memory cell at a read voltage equal to the supply voltage and write to the memory cell at a write voltage twice the supply voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
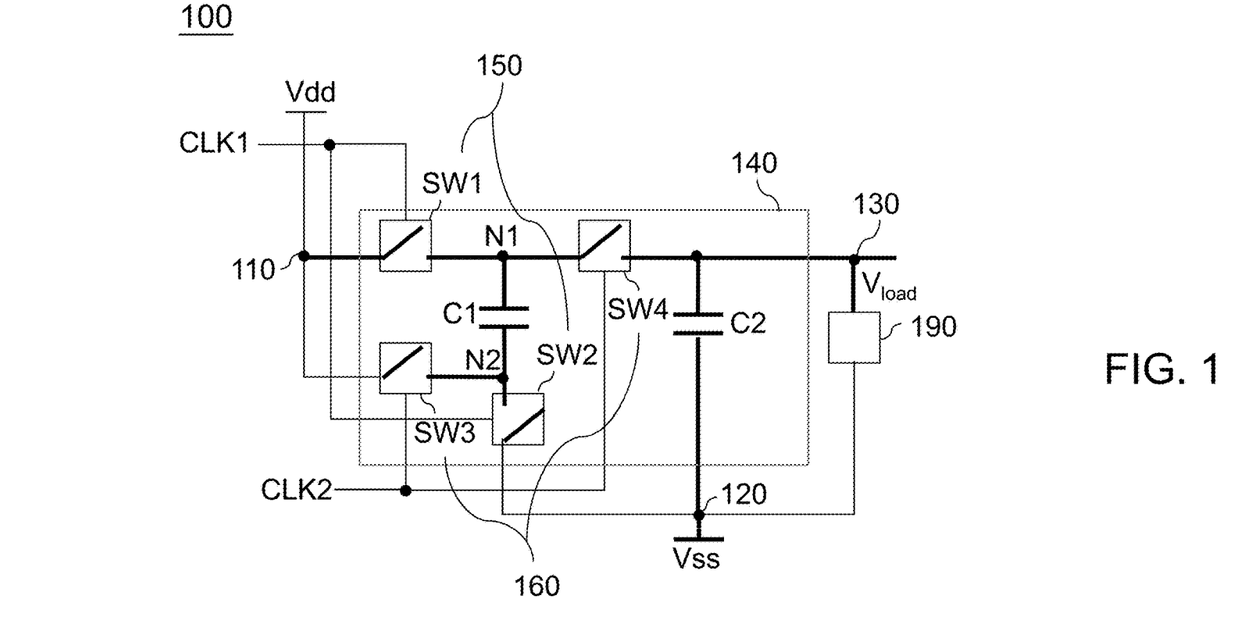
FIG. 1 is a schematic diagram illustrating an exemplary device in accordance with some embodiments.

The present disclosure provides a device, e.g., an integrated circuit, that in an exemplary embodiment includes a voltage multiplier, e.g., voltage multiplier 140 of FIG. 1. The voltage multiplier 140 is controlled by first and second clock signals, e.g., first and second clock signals (CLK1, CLK2) in FIG. 2, so as to generate a load voltage, e.g., 0.8V, higher than, e.g., about twice, a supply voltage, e.g., 0.4V, for driving a load. The voltage multiplier 140 includes a first capacitive element (C1). Efficiency of the voltage multiplier 140 can be improved by increasing a capacitance of the first capacitive element (C1), e.g., via capacitive element construction.

In further detail, FIG. 1 is a schematic diagram illustrating an exemplary device 100 in accordance with some embodiments. The example device 100 includes a supply node 110, a reference node 120, a load node 130, and a voltage multiplier 140. The supply node 110 is configured to receive a supply voltage (Vdd), e.g., 0.4V. The reference node 120 is configured to receive a reference voltage (Vss), e.g., 0V, lower than the supply voltage (Vdd). The voltage multiplier 140 includes first and second nodes (N1, N2), first and second capacitive elements (C1, C2), first and second switch units 150, 160.

The first capacitive element (C1), e.g., a metal-oxide semiconductor capacitor (MOSCAP), a metal-insulator-metal (MIM) capacitor, or other type of capacitor, is connected between the first and second nodes (N1, N2). The first switch unit 150 includes first and second switches (SW1, SW2) and is configured to receive a first clock signal (CLK1) that controls operations of the first and second switches (SW1, SW2). The first switch (SW1) is connected between the supply node 110 and the first node (N1) and is operable so as to selectively connect and disconnect the first node (N1) to and from the supply node 110. The second switch (SW2) is connected between the second node (N2) and the reference node 120 and is operable so as to selectively connect and disconnect the second node (N2) to and from the reference node 120.

Similarly, the second switch unit 160 includes third and fourth switches (SW3, SW4) and is configured to receive a second clock signal (CLK2) that controls operations of the third and fourth switches (SW3, SW4). The third switch (SW3) is connected between the supply node 110 and the second node (N2) and is operable so as to selectively connect and disconnect the second node (N2) to and from the supply node 110. The fourth switch (SW4) is connected between the first node (N1) and the load node 130 and is operable so as to selectively connect and disconnect the first node (N1) to and from the load node 130. In this embodiment, the switches (SW1-SW4) are n-type field-effect transistors (FETs). In some embodiments, one of the switches (SW1-SW4) is a p-type FET. In other embodiments, one of the switches (SW1-SW4) is any sort of transistor, e.g., a bipolar junction transistors (BJT), or other type of switch.

The second capacitive element (C2), e.g., a MOSCAP, a MIM capacitor, or other type of capacitor, is connected between the load node 130 and the reference node 120.

A load 190 is connected across the second capacitive element (C2). The load 190 is, in an exemplary embodiment, a time-to-digital converter (TDC) that converts time information into a digital code. For example, the TDC 190 may output a series of 1's and 0's indicating levels of signals at a certain point in time. Such a circuit may be useful in an all-digital phase lock loop (ADPLL) system. In some embodiments, the device 100 includes the load 190. In other embodiments, the device 100 does not include the load 190 and the load 190 may be connected to the load node 130 externally of the device 100.

Figure 2:
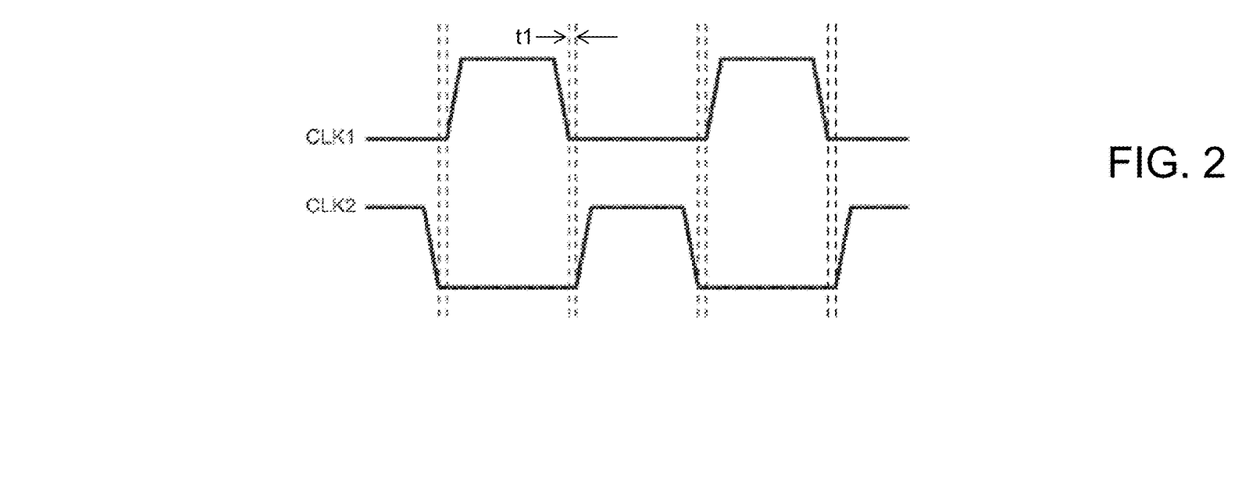
FIG. 2 is a schematic diagram illustrating the relationship between first and second clock signals in accordance with some embodiments.

FIG. 2 is a schematic diagram illustrating the relationship between the first and second clock signals (CLK1, CLK2) in accordance with some embodiments. Each of the first and second clock signals (CLK1, CLK2) alternates between a low signal level, e.g., reference voltage (Vss) level, and a high signal level, e.g., twice the supply voltage (Vdd) level. In the example of the FIG. 2, the high signal levels of the first clock signal (CLK1) and the high signal levels of the second clock signal (CLK2) do not overlap with each other in time. That is, as illustrated in FIG. 2, there is a time (t1) between a falling/rising edge of the first clock signal (CLK1) and a rising/falling edge of the second clock signal (CLK2). As will be apparent from the discussion which follows, the time (t1) is determined to ensure that the duration thereof, e.g., about 0.5 μs, is long enough so that falling/rising edges of the first clock signal (CLK1) and rising/falling edges of the second clock signal (CLK2) do not overlap, preventing short-circuiting of the supply node 110 and the reference node 120. The time (t1) is further determined to ensure that the duration thereof is short enough so that the load 190 is driven at a substantially constant load voltage ($V_{LOAD}$) by the voltage multiplier 140.

Figure 3:
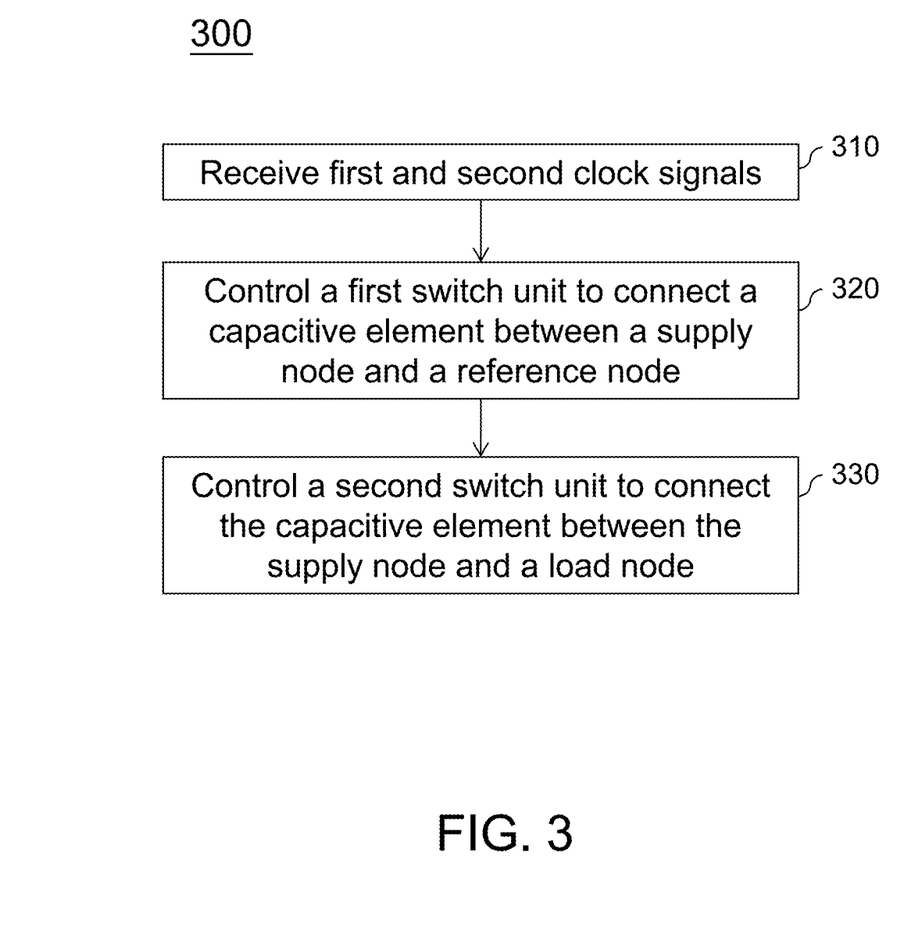
FIG. 3 is a flow chart illustrating an exemplary method of operation of a device in accordance with some embodiments.

FIG. 3 is a flow chart illustrating an exemplary method 300 of operation of the device 100 in accordance with some embodiments. The example method 300 is described with further reference to FIG. 1 for ease of understanding. It should be understood that method 300 is applicable to structures other than that in FIG. 1. In operation 310, the first switch unit 150 receives the first clock signal (CLK1) and the second switch unit 160 receives the second clock signal (CLK2).

After a time (t1), in operation 320, the first clock signal (CLK1) transitions from a low signal level to a high signal level and controls the first switch (SW1) to connect the first node (N1) to the supply node 110 and the second switch (SW2) to connect the second node (N2) to the reference node 120. This connects the first capacitive element (C1) between the supply node 110 and the reference node 120, charging the first capacitive element (C1) to the supply voltage (Vdd). At this time, the second clock signal (CLK2) is at the low signal level and controls the third switch (SW3) to disconnect the second node (N2) from the supply node 110 and the fourth switch (SW4) to disconnect the first node (N1) from the load node 130.

Next, the first clock signal (CLK1) transitions back to the low signal level and controls the first switch (SW1) to disconnect the first node (N1) from the supply node 110 and the second switch (SW2) to disconnect the second node (N2) from the reference node 120. After a time (t1), in operation 330, the second clock signal (CLK2) transitions from the low signal level to the high signal level and controls the third switch (SW3) to connect the second node (N2) to the supply node 110 and the fourth switch (SW4) to connect the first node (N1) to the load node 130. This connects the first capacitive element (C1) between the supply node 110 and the load node 130, providing a load voltage (Vload) substantially equal to the sum of the supply voltage (Vdd) and a charged voltage across the first capacitive element (C1) at the load node 130. This, in turn, charges the second capacitive element (C2) to the load voltage (Vload). As a result, the load 190 is driven at the load voltage (Vload) about twice the supply voltage (Vdd).

From an experimental result, at a given current, e.g., 400 uA, flowing through the load 190, the device 100 provides a substantially constant load voltage (Vload), e.g., about 91% to about 99% of two times the supply voltage (Vdd), and a relatively small ripple voltage, e.g., about 20 mV to about 30 mV. Further, the device 100 outputs the load voltage (Vload) within a short period of time, e.g., 8 Ξs, after the device 100 receives the supply voltage (Vdd).

Figure 4:
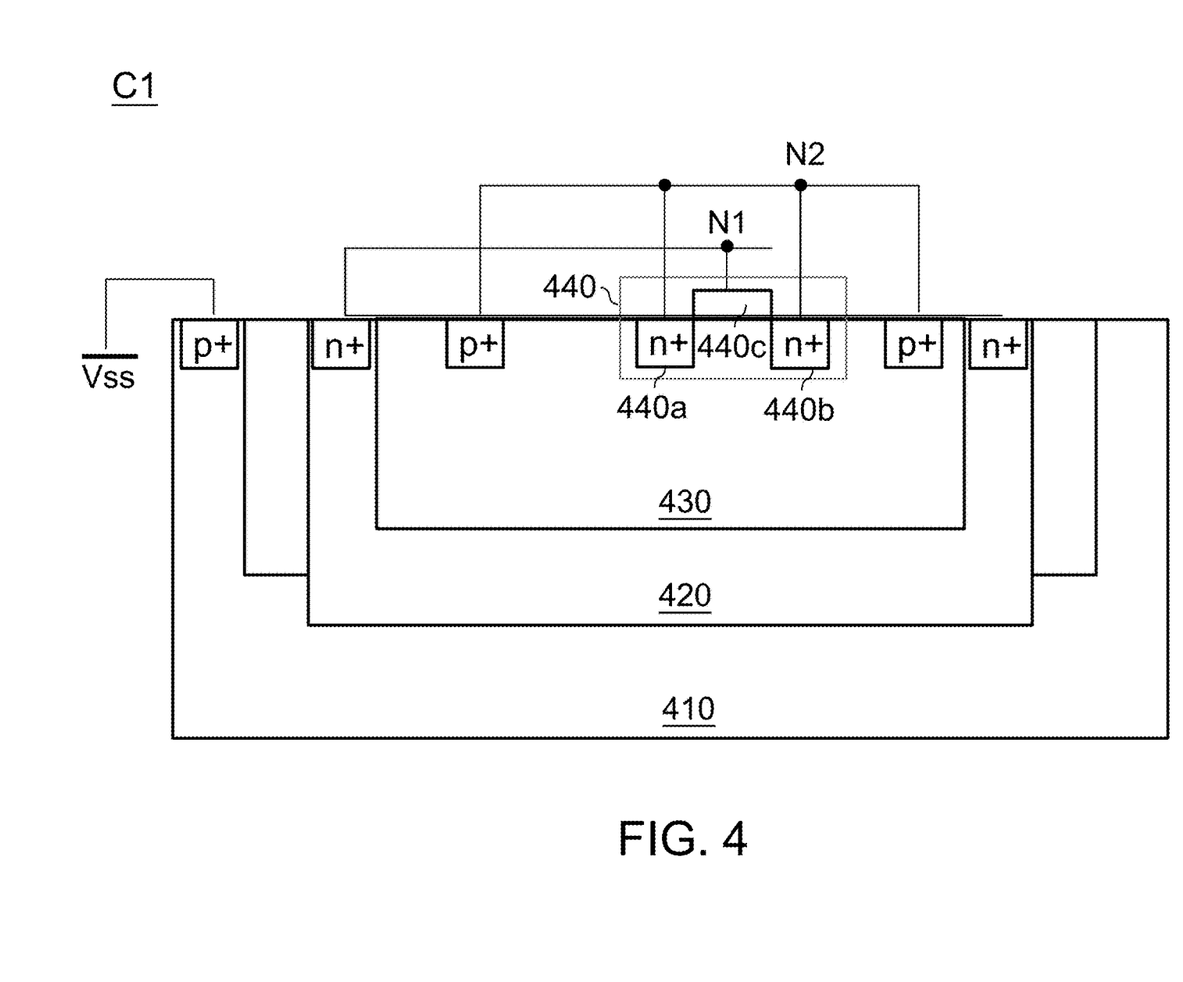
FIG. 4 is a schematic sectional view illustrating an exemplary capacitive element in accordance with some embodiments.
Figure 5:
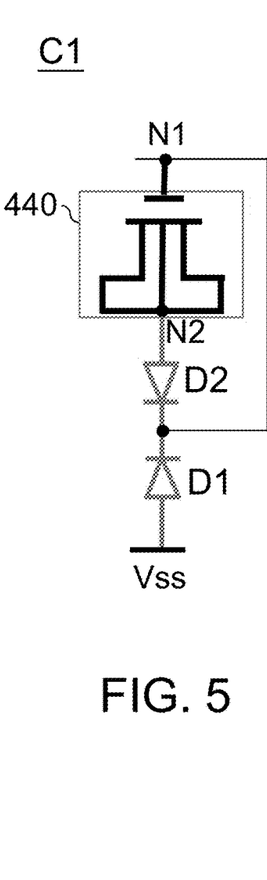
FIG. 5 is a schematic diagram illustrating an equivalent circuit of a capacitive element in accordance with some embodiments.

As noted above, capacitance of a capacitive element (e.g., C1) can be influenced by capacitive element construction. FIG. 4 is a schematic sectional view illustrating an exemplary first capacitive element (C1) in accordance with some embodiments. The first capacitive element (C1) includes a substrate 410, first and second well regions 420, 430, and a transistor 440. The substrate 410 has a p-type conductivity and is connected to the reference node 120. The substrate 410 may include silicon, germanium, other semiconductor material, or a combination thereof. The first well region 420 is formed, such as by implantation, in a portion of the substrate 410. The first well region 420 may include the same material as the substrate 410, but is doped with n-type impurities and thus have an n-type conductivity. FIG. 5 is schematic diagram illustrating an exemplary equivalent circuit of the first capacitive element (C1) in accordance with some embodiments. As can be seen from FIG. 5, because the substrate 410 and the first well region 420 have different conductivity types, the substrate 410 and the first well region 420 cooperatively form a diode (D1).

The second well region 430 is implanted in a portion of the first well region 420, includes the same material as the substrate 410, and has a p-type conductivity. The first well region 420 extends deeper into the substrate 410 than the second well region 430. As can be seen from FIG. 5, because the first well region 420 and the second well region 430 have different conductivity types, the first well region 420 and the second well region 430 cooperatively form a diode (D2) connected to the diode (D1).

The transistor 440 is over the second well region 430 and includes source and drain regions 440*a*, 440*b* that has an n-type conductivity and that are implanted in the second well region 430. The transistor 440 further includes a gate region 440*c* over a channel region between the source and drain regions 440*a*, 440*b*. As can be seen from FIG. 5, because the source and drain regions 440*a*, 440*b* are connected to each other and to the second node (N2), the first capacitive element (C1) is formed by the transistor 440. The second well region 430 is connected to the second node (N2) so as not to leave the second well region 430 floating. The first well region 420 and the gate region 440*c* are connected to each other and to the first node (N1). This results in an increased capacitance for the first capacitive element (C1), e.g., about 10% from a capacitance thereof when the first well region 420 and the gate region 440*c* are disconnected from each other, without enlarging a physical size of the first capacitive element (C1), improving an efficiency of the device 100, for as much as 12%.

Figure 6:
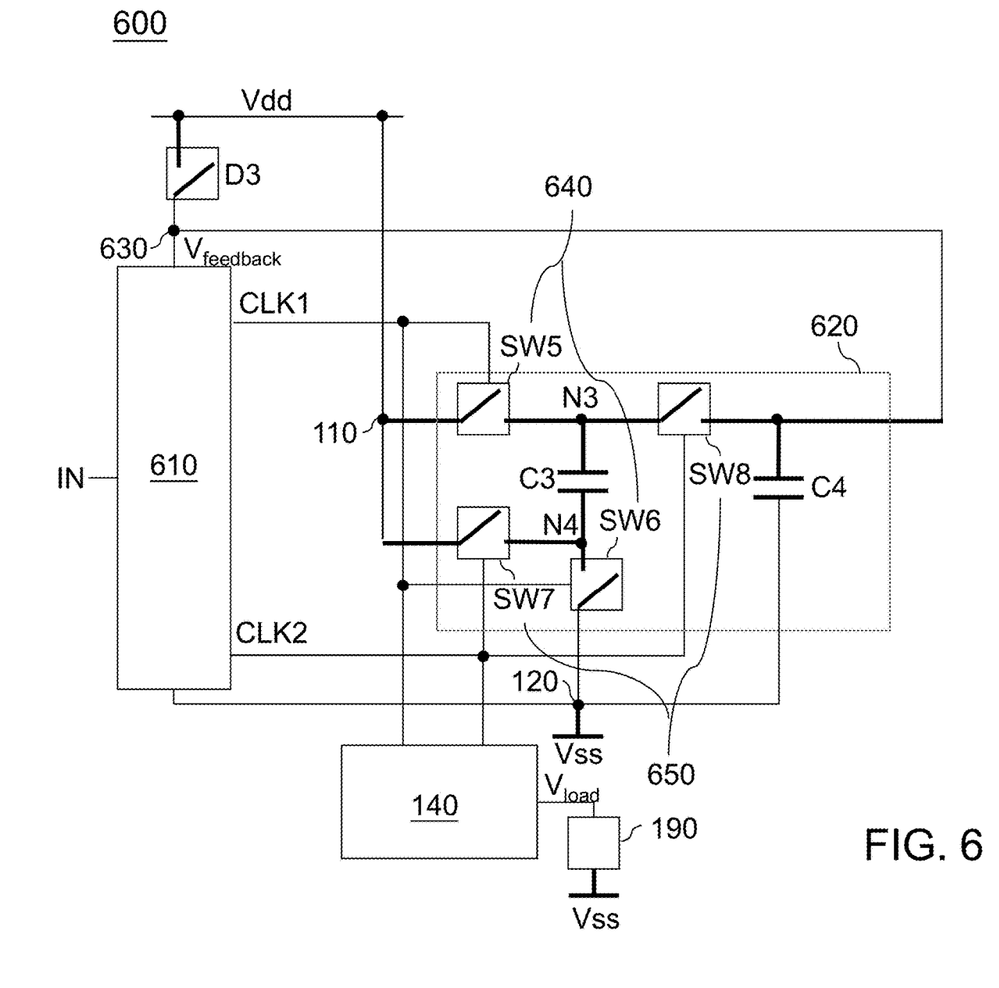
FIG. 6 is a schematic diagram illustrating an exemplary device in accordance with some embodiments.

FIG. 6 is a schematic diagram illustrating an exemplary device 600 in accordance with some embodiments. This embodiment differs from the previous embodiment in that the example device 600 further includes a clock generator 610 and a second voltage multiplier 620. The clock generator 610 is connected between a feedback node 630 and the reference node 120 and includes first and second modules (not shown). The first module, e.g., a cross-coupled flip-flop, is configured to receive an input signal (IN) and to generate the first and second clock signals (CLK1, CLK2) that each correspond to the input signal (IN) and alternate between a low signal level, e.g., reference voltage (Vss) level, and a high signal level, e.g., level of a feedback voltage (Vfeedback) at the feedback node 630. The second module is configured to introduce a delay, i.e., the time (t1), between a falling/rising edge of the first clock signal (CLK1) and a rising/falling edge of the second clock signal (CLK2). In an implementation, the second module includes a pair of inverters connected in series.

The voltage multiplier 140 is connected to the clock generator 610, is configured to receive the first and second clock signals (CLK1, CLK2) and, as described above, is controlled by the first and second clock signals (CLK1, CLK2) so as to generate a load voltage (Vload) higher than, e.g., about twice, the supply voltage (Vdd) for driving the load 190.

The second voltage multiplier 620 is connected to the clock generator 610, is configured to receive the first and second clock signals (CLK1, CLK2), and is controlled by the first and second clock signals (CLK1, CLK2) so as to generate the feedback voltage (Vfeedback) higher than, e.g., about twice, the supply voltage (Vdd) for driving the clock generator 610.

In further detail, a switch (D3), e.g., one or more diodes, is connected between the supply node 110 and the feedback node 630. The switch (D3) connects the feedback node 630 to the supply node 110, e.g., is forward biased, when the feedback voltage (Vfeedback) is less than the supply voltage (Vdd), and disconnects the feedback node 630 from the supply node 110, e.g., is reversed biased, when the feedback voltage (Vfeedback) increases to greater than the supply voltage (Vdd). In an embodiment, the switch (D3) includes one or more diode-connected FETs, any sort of diode, or other type of switch.

The second voltage multiplier 620 includes third and fourth nodes (N3, N4), third and fourth capacitive elements (C3, C4), and third and fourth switch units 640, 650. The third capacitive element (C3) is connected between the third and fourth nodes (N3, N4). In this embodiment, the third capacitive element (C3) has a structure similar to that described above in connection with the first capacitive element (C1). The third switch unit 640 includes fifth and sixth switches (SW5, SW6), is connected to the clock generator 610, and is configured to receive the first clock signal (CLK1) that controls operations of the fifth and sixth switches (SW5, SW6). The fifth switch (SW5) is connected between the supply node 110 and the third node (N3) and is operable so as to selectively connect and disconnect the third node (N3) to and from the supply node 110. The sixth switch (SW6) is connected between the fourth node (N4) and the reference node 120 and is operable so as to selectively connect and disconnect the fourth node (N4) to and from the reference node 120.

Similarly, the fourth switch unit 650 includes seventh and eighth switches (SW7, SW8), is connected to the clock generator 610, and is configured to receive the second clock signal (CLK2) that controls operations of the seventh and eighth switches (SW7, SW8). The seventh switch (SW7) is connected between the supply node 110 and fourth node (N4) and is operable so as to selectively connect and disconnect the fourth node (N4) to and from the supply node 110. The eighth switch (SW8) is connected between the third node (N3) and the feedback node 630 and is operable so as to selectively connect and disconnect the third node (N3) to and from the feedback node 630. In this embodiment, the switches (SW5-SW8) are n-type FETs. In some embodiments, at least one of the switches (SW5-SW8) is a p-type FET. In other embodiments, at least one of the switches (SW5-SW8) is any sort of transistor, e.g., a BJT, or other type of switch.

The fourth capacitive element (C4), e.g., a MOSCAP, a MIM capacitor, or other type of capacitor, is connected between the feedback node 630 and the reference node 120.

Figure 7:
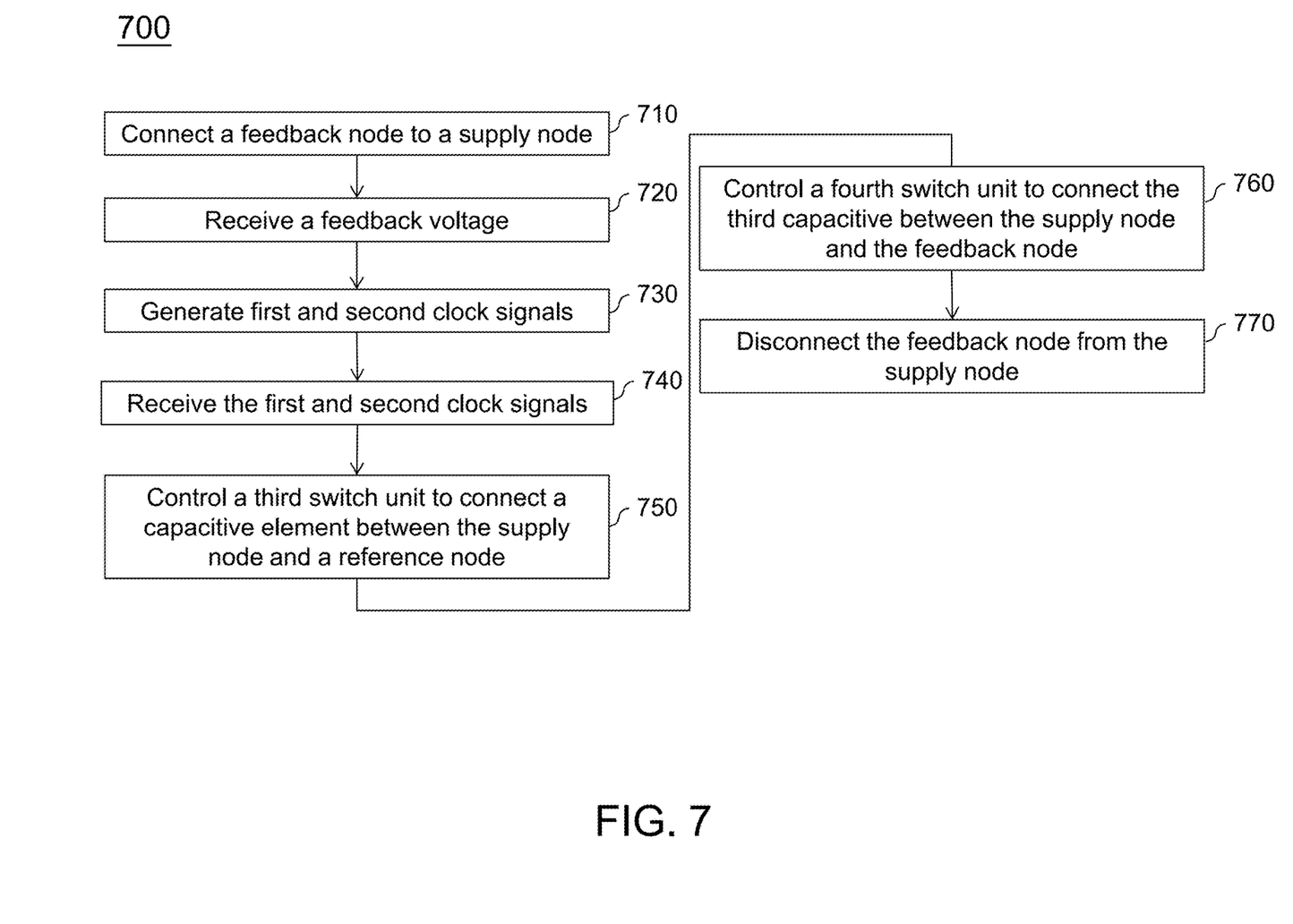
FIG. 7 is a flow chart illustrating an exemplary method of operation of a device in accordance with some embodiments.

As will be apparent from the discussion which follows, the time (t1) is determined to ensure that the duration thereof is long enough so that falling/rising edges of the first clock signal (CLK1) and rising/falling edges of the second clock signal (CLK2) do not overlap, preventing short-circuiting of the supply node 110 and the reference node 120. Further, the time (t1) is determined to ensure that the duration thereof is short enough so that the clock generator 610 is driven at a substantially constant feedback voltage (Vfeedback) by the second voltage multiplier 620. FIG. 7 is a flow chart illustrating an exemplary method 700 of operation of the device 600 in accordance with some embodiments. The example method 700 is described with further reference to FIG. 6 for ease of understanding. It should be understood that method 700 is applicable to structures other than that in FIG. 6. In operation 710, the switch (D3) connects the feedback node 630 to the supply node 110.

In operation 720, the feedback node 630 receives a feedback voltage (Vfeedback) less than the supply voltage (Vdd), e.g., substantially equal to the difference between the supply voltage (Vdd) and a voltage drop across the switch (D3). In operation 730, the clock generator 610 receives an input signal (IN) and generates the first and second clock signals (CLK1, CLK2). In operation 740, the third switch unit 640 receives the first clock signal (CLK1) and the fourth switch unit 650 receives the second clock signal (CLK2).

After a time (t1), in operation 750, the first clock signal (CLK1) transitions from a low signal level to a high signal level and controls the fifth switch (SW5) to connect the third node (N3) to the supply node 110 and the sixth switch (SW6) to connect the fourth node (N4) to the reference node 120. This connects the third capacitive element (C3) between the supply node 110 and the reference node 120, charging the third capacitive element (C3) to the supply voltage (Vdd). At this time, the second clock signal (CLK2) is at the low signal level and controls the seventh switch (SW7) to disconnect the fourth node (N4) from the supply node 110 and the eighth switch (SW8) to disconnect the third node (N3) from the feedback node 630.

Next, the first clock signal (CLK1) transitions back to the low signal level and controls the fifth switch (SW5) to disconnect the third node (N3) from the supply node 110 and the sixth switch (SW6) to disconnect the fourth node (N4) from the reference node 120. After a time (t1), in operation 760, the second clock signal (CLK2) transitions from the low signal level to the high signal level and controls the seventh switch (SW7) to connect the fourth node (N4) to the supply node 110 and the eighth switch (SW8) to connect the third node (N3) to the feedback node 630. This connects the third capacitive element (C3) between the supply node 110 and the feedback node 630, increasing the feedback voltage (Vfeedback) to substantially the sum of the supply voltage (Vdd) and the charged voltage across the third capacitive element (C3). This, in turn, charges the fourth capacitive element (C4) to the feedback voltage (Vfeedback). In operation 770, the switch (D3) disconnects the feedback node 630 from the supply node 110 when the feedback voltage (Vfeedback) increases to greater than the supply voltage (Vdd). As a result, the clock generator 610 is driven at the feedback voltage (Vfeedback) about twice the supply voltage (Vdd), thereby enabling the clock generator 610 to generate the first and second clock signals (CLK1, CLK2), each of which alternates between a low signal level, e.g., reference voltage (Vss) level, and a high signal level, e.g., twice the supply voltage (Vdd) level.

As described above, the second voltage multiplier 620 enables the clock generator 610 to generate first and second clock signals (CLK1, CLK2) that have a high signal level greater than the supply voltage (Vdd) level. In some embodiments, method 700 further includes operations 310-330 of method 300. In such some embodiments, the voltage multiplier 140 uses the first and second clock signals (CLK1, CLK2) output by the clock generator 610 to generate the load voltage (Vload) greater than the supply voltage (Vdd) at which the voltage multiplier 140 operates. As such, in other embodiments, the voltage multiplier 140 may be replaced with a circuit so long that it operates at a supply voltage (Vdd) and at a clock signal, a level of which is greater than the supply voltage (Vdd) level.

In an alternative embodiment where the load 190 is light and does not draw as much load current as a heavy load, the device 600 does not include the voltage multiplier 140 and the load 190 is connected to the feedback node 630. That is, in such an alternative embodiment, the second voltage multiplier 620 is configured to drive both the load 190 and the clock generator 610 at a voltage greater than, e.g., twice, the supply voltage (Vdd).

In an embodiment, a device comprises a capacitive element that is coupled between first and second nodes and that includes a first well region, a second well region, and a transistor. The second well region is formed in the first well region, has a different conductivity type than the first well region, and is coupled to the second node. The transistor includes source and drain regions formed in the second well region and coupled to each other and to the second node, a channel region between the source and drain regions, and a gate region over the channel region. The first well region and the gate region are coupled to each other and to the first node.

In another embodiment, a device comprises a clock generator and a voltage multiplier. The clock generator is coupled between a feedback node and a reference node and is configured to generate a clock signal that alternates between a level of a feedback voltage at the feedback node and a level of a reference voltage at the reference node. The voltage multiplier includes a capacitive element and a switch unit. The capacitive element is coupled between first and second nodes. The switch unit is controlled by the clock signal so as to selectively couple the second node to a supply node and the first node to the feedback node, thereby increasing the feedback voltage to substantially the sum of a supply voltage at the supply node and a charged voltage across the capacitive element.

In another embodiment, a method comprises: coupling a feedback node to a supply node; the feedback node receiving a feedback voltage less than a supply voltage at the supply node; generating a clock signal; and the clock signal controlling a switch unit to couple a capacitive element between the supply node and the feedback node, thereby increasing the feedback voltage to greater than the supply voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a first capacitive element including
a first well region,
a second well region formed in the first well region, having a different conductivity type than the first well region, and coupled to a second node of the first capacitive element, and
a transistor including source and drain regions formed in the second well region and coupled to each other and to the second node of the first capacitive element, a channel region between the source and drain regions, and a gate region over the channel region, wherein the first well region and the gate region are coupled to each other and to a first node of the first capacitive element;
a second capacitive element coupled between a load node and a reference node and configured to be charged to a load voltage;
a first switch unit, wherein the first switch unit further comprises a first switch and a second switch, wherein the first switch is configured so as to couple the first node of the first capacitive element to a supply node, and wherein the second switch is configured so as to couple the second node of the first capacitive element to the reference node, wherein there is no load coupled between the first node of the first capacitive element and the reference node, thereby charging the first capacitive element to a supply voltage at the supply node; and
a second switch unit, wherein the second switch unit further comprises a third switch and a fourth switch, wherein the third switch is configured so as to couple a second node of a second capacitive element to the supply node, and wherein the fourth switch is configured so as to couple a first node of the second capacitive element to the load node, whereby a load coupled between the load node and the reference node is driven at the load voltage substantially equal to the sum of the supply voltage and a charged voltage across the second capacitive element;
a clock generator coupled to a feedback node and configured to generate a first clock signal and a second clock signal, wherein each of the first and the second clock signals alternates between a level of a reference voltage at the reference node and a level of a feedback voltage at the feedback node and controls operation of a respective one of the first and second switch units;
wherein the first switch and the second switch are configured to be controlled by the first clock signal;
wherein the third switch and the fourth switch are configured to be controlled by the second clock signal;
wherein a time between the falling/rising edge of the first clock signal and a rising/falling edge of the second clock signal is configured to be short enough so that a load between the load node and the reference node is driven at a constant load voltage;
wherein a time between a falling/rising edge of the first clock signal and a rising/falling edge of the second signal is configured to be long enough so that the falling/rising edge of the first clock signal and the rising/falling edge of the second clock signal do not overlap.

2. The device of claim 1, further comprising:
a third capacitive element coupled between third and fourth nodes;
a third switch unit controlled by the first clock signal, wherein the third switch unit further comprises a fifth switch and a sixth switch, wherein the fifth switch is configured so as to couple the third node to the supply node, and wherein the sixth switch is configured so as to couple the fourth node to the reference node, thereby charging the third capacitive element to the supply voltage; and
a fourth switch unit controlled by the second clock signal, wherein the fourth switch unit further comprises a seventh switch and an eighth switch, wherein the seventh switch is configured so as to couple the fourth node to the supply node, and wherein the eighth switch is configured to couple the third node to the feedback node, thereby increasing the feedback voltage to substantially the sum of the supply voltage and the charged voltage across the third capacitive element.

3. The device of claim 1, further comprising a fourth capacitive element coupled between the feedback node and the reference node and configured to be charged to the feedback voltage.

4. The device of claim 1, further comprising a ninth switch coupled between the supply node and the feedback node and configured to connect the feedback node to the supply node when the feedback voltage is less than the supply voltage and to disconnect the feedback node from the supply node when the feedback voltage increases to greater than the supply voltage.

5. The device of claim 1, wherein
the capacitive element further includes a substrate.

6. A device comprising:
a clock generator coupled between a feedback node and a reference node and configured to generate a first clock signal and a second clock signal that alternate between a level of a feedback voltage at the feedback node and a level of a reference voltage at the reference node; and
a voltage multiplier including:
at least a first switch unit and a second switch unit, wherein the first switch unit controlled by the first clock signal so as to selectively couple a second node of a first capacitive element to a supply node and a first node of the first capacitive element to the feedback node, thereby increasing the feedback voltage to substantially the sum of a supply voltage at the supply node and a charged voltage across the first capacitive element,
wherein the first switch unit further comprises a first switch and a second switch, wherein the first switch is configured so as to couple the first node to the supply node, and wherein the second switch is configured so as to couple the second node to the reference node, thereby charging the first capacitive element to the supply voltage at the supply node;
wherein the second switch unit further comprises a third switch and a fourth switch, wherein the third switch is configured so as to couple a second node of a second capacitive element to the supply node, and wherein the fourth switch is configured so as to couple a first node of the second capacitive element to a load node, whereby a load coupled between the load node and the reference node is driven at a load voltage substantially equal to the sum of the supply voltage across the first second capacitive element;
wherein the first switch and the second switch are configured to be controlled by a first clock signal;
wherein the third switch and the fourth switch are configured to be controlled by a second clock signal;
wherein a time between the falling/rising edge of the first clock signal and a rising/falling edge of the second clock signal is configured to be short enough so that a load between the load node and the reference node is driven at a constant load voltage;
wherein a time between a falling/rising edge of the first clock signal and a rising/falling edge of the second signal is configured to be long enough so that the falling/rising edge of the first clock signal and the rising/falling edge of the second clock signal do not overlap.

7. The device of claim 6, wherein the voltage multiplier further includes a second switch unit controlled by the second clock signal so as to selectively couple the first node to the supply node and the second node to the reference node, thereby charging the capacitive element to the supply voltage.

8. The device of claim 7, further comprising:
a third capacitive element coupled between third and fourth nodes; and
a third switch unit controlled by the second clock signal so as to selectivity couple the third node to the supply node and the fourth node to the reference node, thereby charging the third capacitive element to the supply voltage.

9. The device of claim 8, further comprising:
a fourth switch unit controlled by the second clock signal so as to selectivity couple the fourth node to the supply node and the third node to the feedback node, whereby a load coupled between the load node and the reference node is driven at a load voltage greater than the supply voltage.

10. The device of claim 9, further comprising a second capacitive element coupled between the load node and the reference node and configured to be charged to the load voltage.

11. The device of claim 6, further comprising a ninth switch coupled between the supply node and the feedback node and configured to connect the feedback node to the supply node when the feedback voltage is less than the supply voltage and to disconnect the feedback node from the supply node when the feedback voltage increases to greater than the supply voltage.

12. The device of claim 6, wherein the first capacitive element includes:
a first well region,
a second well region formed in the first well region, having a different conductivity type than the first well region, and coupled to the second node, and
a transistor including source and drain regions formed in the second well region and coupled to each other and to the second node, a channel region between the source and drain regions, and a gate region over the channel region, wherein the first well region and the gate region are coupled to each other and to the first node.

13. The device of claim 6, further comprising a second load coupled to the feedback node.

14. The device of claim 6, further comprising a fourth capacitive element coupled between the feedback node and the reference node and configured to be charged to the feedback voltage.

15. A method comprising:
deploying a first capacitive element;
deploying at least a first switch unit and a second switch unit;
coupling a feedback node to a supply node;
the feedback node receiving a feedback voltage less than a supply voltage at the supply node;
deploying a clock generator coupled to the feedback node and configured to generate a first clock signal and a second clock signal, wherein each of the first and the second clock signals alternates between a level of a reference voltage at a reference node and a level of the feedback voltage at the feedback node and controls operation of a respective one of the first and second switch units;
generating the first clock signal;
generating the second clock signal;
the first clock signal controlling the first switch unit to couple a first capacitive element between the supply node and the feedback node, thereby increasing the feedback voltage to greater than the supply voltage;
deploying a second capacitive element coupled between a load node and the reference node and configured to be charged to the load voltage;
wherein the first switch unit further comprises a first switch and a second switch, wherein the first switch is configured so as to couple a first node of the first capacitive element to the supply node, and wherein the second switch is configured so as to couple a second node of the first capacitive element to the reference node, thereby charging the first capacitive element to the supply voltage at the supply node;
the second clock signal controlling the second switch unit to couple the capacitive element between the supply node and the reference node, thereby charging the capacitive element to the supply voltage;
wherein the second switch unit further comprises a third switch and a fourth switch, wherein the third switch is configured so as to couple a second node of a second capacitive element to the supply node, and wherein the fourth switch is configured so as to couple a first node of the second capacitive element to the load node, whereby a load coupled between the load node and the reference node is driven at a load voltage substantially equal to the sum of the supply voltage across the first second capacitive element;
wherein the first switch and the second switch are configured to be controlled by a first clock signal, wherein the third switch and the fourth switch are configured to be controlled by a second clock signal, and wherein a time between a falling/rising edge of the first clock signal and a rising/falling edge of the second signal is configured to be long enough so that the falling/rising edge of the first clock signal and the rising/falling edge of the second clock signal do not overlap.

16. The method of claim 15,
wherein a time between a falling/rising edge of the first clock signal and a rising/falling edge of the second signal is configured to be long enough so that the falling/rising edge of the first clock signal and the rising/falling edge of the second clock signal do not overlap.

17. The method of claim 15, further comprising decoupling the feedback node from the supply node when the feedback voltage increases to greater than the supply voltage.

18. The method of claim 16, wherein the time between the falling/rising edge of the first clock signal and the rising/falling edge of the second signal is configured to be short enough so that the load is driven at a constant load voltage.

19. The device of claim 5, wherein the first well region is formed in the substrate.

20. The device of claim 19, wherein the substrate has a different conductivity type than the first well region and is coupled to the reference node.

* * * * *